(12) United States Patent
Romero et al.

(10) Patent No.: US 7,608,499 B2
(45) Date of Patent: Oct. 27, 2009

(54) SEMICONDUCTOR STRUCTURE COMPRISING FIELD EFFECT TRANSISTORS WITH STRESSED CHANNEL REGIONS AND METHOD OF FORMING THE SAME

(75) Inventors: Karla Romero, Dresden (DE); Sven Beyer, Dresden (DE); Jan Hoentschel, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 323 days.

(21) Appl. No.: 11/685,847

(22) Filed: Mar. 14, 2007

(65) Prior Publication Data

US 2008/0023771 A1 Jan. 31, 2008

(30) Foreign Application Priority Data

Jul. 31, 2006 (DE) .................... 10 2006 035 666

(51) Int. Cl.
*H01L 21/8238* (2006.01)
(52) U.S. Cl. .................. 438/199; 438/230; 257/369
(58) Field of Classification Search ............ 438/199, 438/230; 257/369, 192
See application file for complete search history.

(56) References Cited

U.S. PATENT DOCUMENTS

| 7,303,949 | B2 * | 12/2007 | Chen et al. ........... 438/199 |
| 2004/0262683 | A1 | 12/2004 | Bohr et al. ........... 257/338 |
| 2005/0112817 | A1 | 5/2005 | Cheng et al. ........... 438/219 |
| 2005/0266631 | A1 | 12/2005 | Kim et al. ........... 438/216 |

OTHER PUBLICATIONS

Chan et al., "Strain for CMOS Performance Improvement," *IEEE 2005 Custom Integrated Circuits Conference*, pp. 667-674, 2005.

* cited by examiner

*Primary Examiner*—Mark Prenty
(74) *Attorney, Agent, or Firm*—Williams, Morgan & Amerson, P.C.

(57) ABSTRACT

A method of forming a semiconductor structure comprises providing a semiconductor substrate comprising a first transistor element and a second transistor element. Each of the first transistor element and the second transistor element comprises a gate electrode. A stressed material layer is deposited over the first transistor element and the second transistor element. The stressed material layer is processed to form from the stressed material layer sidewall spacers adjacent the gate electrode of the second transistor element and a hard mask covering the first transistor element. A pair of cavities is formed adjacent the gate electrode of the second transistor element. A pair of stress-creating elements is formed in the cavities and the hard mask is at least partially removed.

24 Claims, 6 Drawing Sheets

SEMICONDUCTOR STRUCTURE COMPRISING FIELD EFFECT TRANSISTORS WITH STRESSED CHANNEL REGIONS AND METHOD OF FORMING THE SAME

BACKGROUND OF THE INVENTION

1. Field of the Invention

The subject matter disclosed herein generally relates to the formation of integrated circuits, and, more particularly, to the formation of semiconductor structures comprising field effect transistors having differently stressed channel regions.

2. Description of the Related Art

Integrated circuits comprise a large number of individual circuit elements, such as transistors, capacitors, resistors and the like. These elements are connected internally to form complex circuits such as memory devices, logic devices and microprocessors. The performance of integrated circuits can be improved by increasing the number of functional elements in the circuit in order to increase their functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Field effect transistors are used as switching elements in integrated circuits. They provide a means to control a current flowing through a channel region located between a source region and a drain region. The source region and the drain region are highly doped. In N-type transistors, the source and drain regions are doped with an N-type dopant. Conversely, in P-type transistors, the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

When reducing the size of field effect transistors, it is important to maintain a high conductivity of the channel region in the "on" state. The conductivity of the channel region in the "on" state depends on the dopant concentration in the channel region, the mobility of the charge carriers, the extension of the channel region in the width direction of the transistor and the distance between the source region and the drain region, which is commonly denoted as "channel length." While a reduction of the width of the channel region leads to a decrease of the channel conductivity, a reduction of the channel length enhances the channel conductivity. An increase of the charge carrier mobility leads to an increase of the channel conductivity.

As feature sizes are reduced, the extension of the channel region in the width direction is also reduced. A reduction of the channel length entails a plurality of issues associated therewith. First, advanced techniques of photolithography and etching have to be provided in order to reliably and reproducibly create transistors having short channel lengths. Moreover, highly sophisticated dopant profiles, in the vertical direction as well as in the lateral direction, are required in the source region and in the drain region in order to provide a low sheet resistivity and a low contact resistivity in combination with a desired channel controllability.

In view of the problems associated with a further reduction of the channel length, it has been proposed to also enhance the performance of field effect transistors by increasing the charge carrier mobility in the channel region. In principle, at least two approaches may be used to increase the charge carrier mobility.

First, the dopant concentration in the channel region may be reduced. Thus, the probability of scattering events of charge carriers in the channel region is reduced, which leads to an increase of the conductivity of the channel region. Reducing the dopant concentration in the channel region, however, significantly affects the threshold voltage of the transistor device. This makes the reduction of dopant concentration a less attractive approach.

Second, the lattice structure in the channel region may be modified by creating tensile or compressive stress. This leads to a modified mobility of electrons and holes, respectively. Depending on the magnitude of the stress, a compressive stress may significantly increase the mobility of holes in a silicon layer. The mobility of electrons may be increased by providing a silicon layer having a tensile stress.

A method of forming a field effect transistor wherein the channel region is formed in stressed silicon will be described in the following with reference to FIGS. 1a-1d. FIG. 1a shows a schematic cross-sectional view of a semiconductor structure 100 in a first stage of a manufacturing process according to the state of the art. The semiconductor structure 100 comprises a substrate 101. An active region 104 is provided in the substrate 101. A trench isolation structure 102 separates the active region 104 from other elements of the semiconductor structure 100 which are not shown in FIG. 1a. A gate electrode 106, which is separated from the substrate 101 by a gate insulation layer 105, is formed over the substrate 101. The gate electrode 106 is covered by a cap layer 107 and flanked by first sidewall spacers 108, 109. The active region 104, the trench isolation structure 102, the gate electrode 106, the gate insulation layer 105, as well as the first sidewall spacers 108, 109, and the cap layer 107 together form portions of a field effect transistor element 130.

In the formation of the semiconductor structure 100, the substrate 101 is provided and the trench isolation structure 102 is formed by means of methods of photolithography, deposition and/or oxidation known to persons skilled in the art. Then, ions of a dopant material are implanted into the substrate 101 in order to form the active region 104. The type of dopants corresponds to the doping of the channel region of the field effect transistor to be formed. Hence, in the formation of an N-type transistor, ions of a P-type dopant are implanted, whereas ions of an N-type dopant are implanted in the formation of a P-type transistor.

After the formation of the active region 104, an oxidation process is performed to form the gate insulation layer 105. Thereafter, the gate electrode 106 and the cap layer 107 are formed by deposition, etching and photolithography processes that are well known to persons skilled in the art. Subsequently, the first sidewall spacers 108, 109 are formed by depositing a layer of a spacer material and performing an anisotropic etch process wherein portions of the layer of spacer material over substantially horizontal portions of the semiconductor structure 100 are removed, whereas portions of the layer of spacer material provided on the sidewalls of the gate electrode 106 remain on the substrate 101 and form the first sidewall spacers 108, 109.

A schematic cross-sectional view of the semiconductor structure 100 in a later stage of the manufacturing process according to the state of the art is shown in FIG. 1b. An etch process is performed. The etch process can be an isotropic etch process adapted to selectively remove the material of the substrate 101, leaving the material of the cap layer 107 and the first sidewall spacers 108, 109 substantially intact, for example, a known dry etch process. The cap layer 107 and the first sidewall spacers 108, 109 protect the gate electrode 106, the gate insulation layer 105 and a channel region 140 below the gate electrode 106 from being affected by an etchant used in the etch process.

Portions of the substrate 101 adjacent the gate electrode 106, however, are etched away. Thus, a source side cavity 110 and a drain side cavity 111 are formed adjacent the gate electrode 106. Due to the isotropy of the etch process, portions of the substrate 101 below the first sidewall spacers 108, 109 and, optionally, portions of the substrate 201 below the gate electrode 106 are removed. Therefore, the cavities 110, 111 may extend below the sidewall spacers 108, 109 and/or the gate electrode 106, the surface 150, 151 of the cavities 110, 111 having a somewhat rounded shape.

After the etch process, the cavities 110, 111 may have a rough surface 150, 151. If a stress-creating material were deposited over the substrate 101 in order to fill the cavities 110, 111 as described below, unevenness on the bottom surface of the cavities 110, 111 would act as nucleation sites, leading to an undesirable polycrystalline growth of the stress-creating material. Therefore, a process is performed to reduce the roughness of the surface 150, 151 of the cavities.

The roughness reduction process can be a high temperature prebake process wherein the semiconductor structure 100 is exposed to a temperature in a range from about 800-1000° C. for about 30 seconds to about 10 minutes. During the prebake process, the semiconductor structure 100 can be provided in an ambient comprising hydrogen gas which substantially does not react chemically with the materials of the semiconductor structure 100. The high temperature prebake process leads to a diffusion of atoms on the surface of the cavities 110, 111. Due to the diffusion, a material transport may occur which leads to roughness reduction of the surface of the cavities 110, 111.

FIG. 1c shows a schematic cross-sectional view of the semiconductor structure 100 in yet another stage of the manufacturing process. Stress-creating elements 114, 115 are formed adjacent the gate electrode 106. To this end, the cavities 110, 111 are filled with a layer of a stress-creating material. In methods of forming a field effect transistor according to the state of the art, the stress-creating material may comprise silicon germanide. As persons skilled in the art know, silicon germanide is an alloy of silicon (Si) and germanium (Ge). Other materials may be employed as well.

Silicon germanide is a semiconductor material having a greater lattice constant than silicon. When silicon germanide is deposited in the cavities 110, 111, however, the silicon and germanium atoms in the stress-creating elements 114, 115 tend to adapt to the lattice constant of the silicon in the substrate 101. Therefore, the lattice constant of the silicon germanide in the stress-creating elements 114, 115 is smaller than the lattice constant of a bulk silicon germanide crystal. Thus, the material of the stress-creating elements 114, 115 is compressively stressed.

The stress-creating elements 114, 115 can be formed by means of selective epitaxial growth. As persons skilled in the art know, selective epitaxial growth is a variant of plasma enhanced chemical vapor deposition wherein parameters of the deposition process are adapted such that material is deposited only on the surface of the substrate 101 in the cavities 110, 111, whereas substantially no material deposition occurs on the surface of the first sidewall spacers 108, 109 and the cap layer 107.

Since the stress-creating elements 114, 115 are compressively stressed, they exhibit a force to portions of the substrate 101 in the vicinity of the gate electrode 106, in particular to portions of the substrate 101 in the channel region 140. Therefore, a compressive stress is created in the channel region 140.

FIG. 1d shows a schematic cross-sectional view of the semiconductor structure 100 in yet another stage of the manufacturing process according to the state of the art. After the formation of the stress-creating elements 114, 115, the first sidewall spacers 108, 109 are removed. Additionally, the cap layer 107 may be removed. Thereafter, an extended source region 116 and an extended drain region 117 are formed in portions of the substrate 101 and the stress-creating elements 114, 115 by means of an ion implantation process known to persons skilled in the art. In the ion implantation process, ions of a dopant material are introduced into the substrate 101 and the stress-creating elements 114, 115. In case of the formation of an N-type field effect transistor, ions of an N-type dopant are introduced, whereas ions of a P-type dopant are provided in the formation of a P-type transistor.

Subsequently, second sidewall spacers 118, 119 are formed adjacent the gate electrode 106. Thereafter, a further ion implantation process is performed to form a source region 120 and a drain region 121 by introducing dopant material ions.

Finally, an annealing process may be performed to activate the dopant materials introduced in the formation of the extended source region 1 16, the extended drain region 1 17, the source region 120 and the drain region 121.

One problem associated with the above method of forming a field effect transistor according to the state of the art is that N-type field effect transistors and P-type field effect transistors, which may both be present in modern integrated circuits, may require stress of a different type in the channel region. While the performance of P-type field effect transistors may be considerably improved by providing a compressively stressed channel region, a compressive stress may not improve the performance of N-type field effect transistors or may even be detrimental to the performance of N-type field effect transistors. Conversely, a tensile stress may improve the performance of N-type field effect transistors but may be detrimental to the performance of P-type field effect transistors.

Attempts to apply the above-described method of forming a field effect transistor in the formation of semiconductor structures having compressively stressed P-type field effect transistors and N-type field effect transistors having a tensile stress have led to complex and, therefore, expensive manufacturing processes.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment disclosed herein, a method of forming a semiconductor structure comprises providing a semiconductor substrate comprising a first transistor element and a second transistor element. Each of the first transistor element and the second transistor element comprises a gate electrode. A stressed material layer is deposited over the first transistor element and the second transistor element. The stressed material layer is processed to form from the stressed material layer sidewall spacers adjacent the gate electrode of the second transistor element and a hard mask covering the first transistor element. A pair of cavities is formed in the substrate adjacent the gate electrode of the second transistor element. A pair of stress-creating elements is formed in the cavities and the hard mask is at least partially removed.

According to another illustrative embodiment disclosed herein, a semiconductor structure comprises a semiconductor substrate comprising a substrate material. Additionally, the semiconductor structure comprises a first transistor element and a second transistor element. Each of the first transistor element and the second transistor element comprises a gate electrode. The first transistor element comprises a first pair of stressed regions having a first intrinsic stress adjacent the gate electrode of the first transistor element. Each of the first pair of stressed regions comprises the substrate material. The second transistor element comprises a second pair of stressed regions having a second intrinsic stress adjacent the gate electrode of the second transistor element. Each of the second pair of stressed regions comprises a semiconductor material other than the substrate material.

BRIEF DESCRIPTION OF THE DRAWINGS

The disclosure may be understood by reference to the following description taken in conjunction with the accompanying drawings, in which like reference numerals identify like elements, and in which.

Figure 1A:
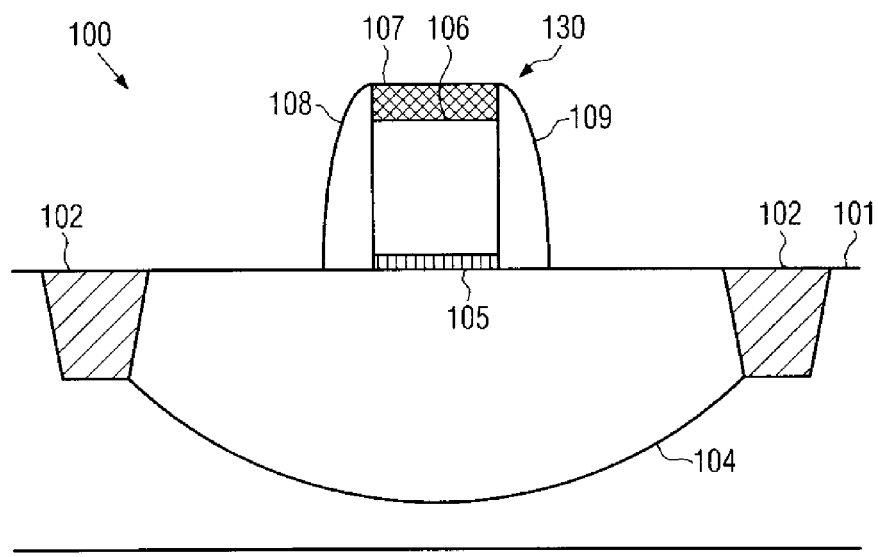
FIGS. 1a-1d show schematic cross-sectional views of a semiconductor structure in stages of a manufacturing process according to the state of the art.
Figure 1B:
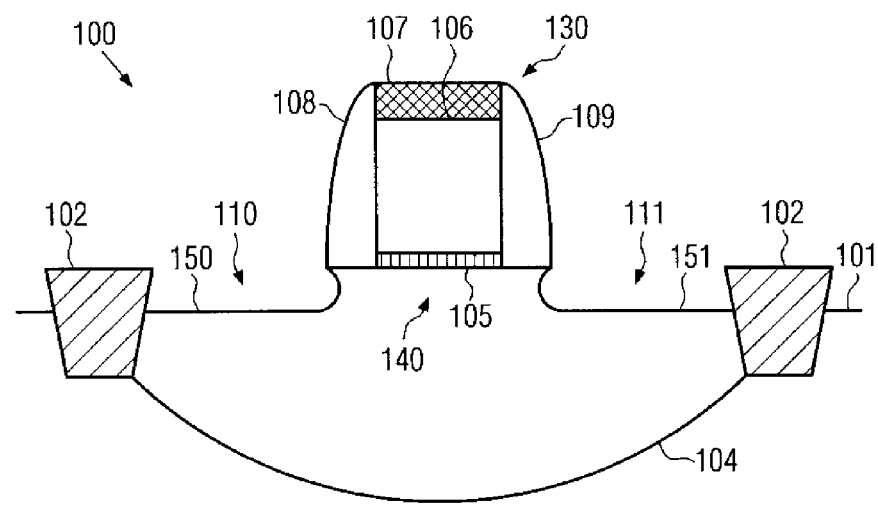
Figure 1C:
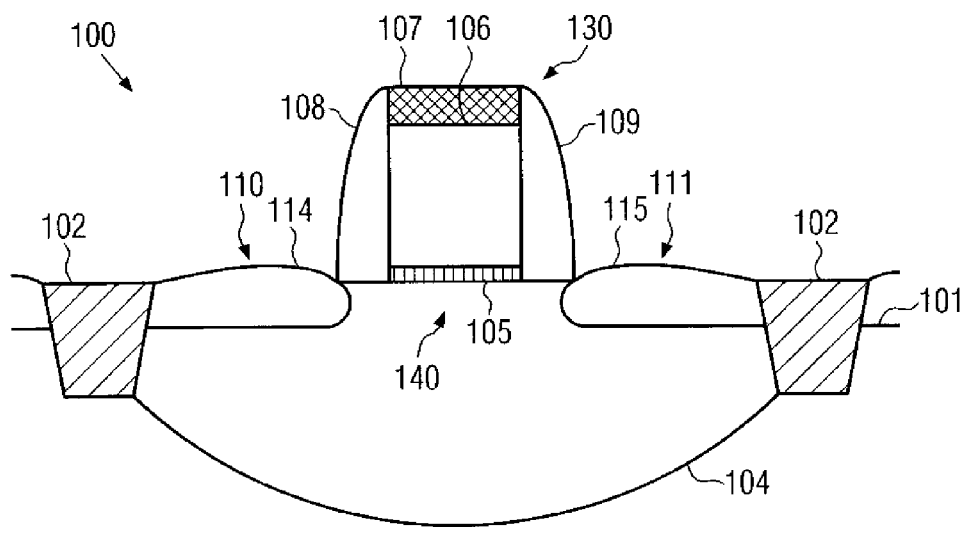
Figure 1D:
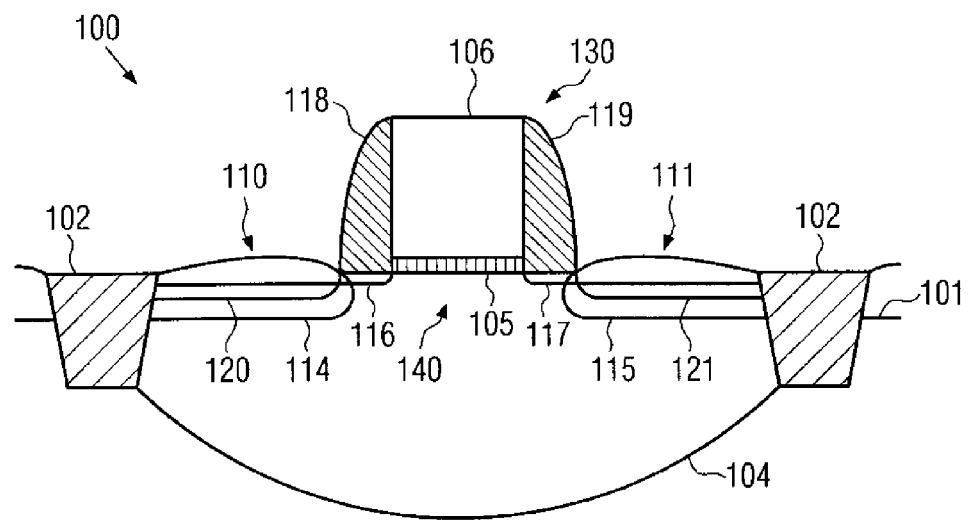

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein allows the formation of a semiconductor structure comprising a first transistor element and a second transistor element, wherein both the first transistor element and the second transistor element comprise stressed regions adjacent their gate electrodes. In the first transistor element, the stressed regions can comprise a material of a semiconductor substrate on which the first transistor element and the second transistor element are formed. Contrary thereto, in the second transistor element, the stressed regions may comprise a material different from that of the semiconductor substrate.

The stress in the stressed regions of the first transistor element can be created by a stress memorization technique. In the stress memorization technique, the semiconductor substrate adjacent the gate electrode of the first transistor element may be processed in such a manner that the atoms of the semiconductor substrate adjacent the gate electrode of the first transistor element arrange in a configuration comprising an intrinsic stress. Such processing may comprise, for example, an amorphization of portions of the semiconductor substrate prior to the formation of the stressed material layer and an annealing of the semiconductor substrate after the formation of the stressed material layer. The intrinsically stressed configuration of the atoms in the portions of the semiconductor substrate adjacent the gate electrode of the first transistor element may be at least partially maintained after the removal of the stressed material layer. In the following, such a configuration will be denoted as "memorized stress."

Since the intrinsic stress of portions of the first transistor element may be at least partially maintained in the absence of the stressed material layer, the material of the stressed material layer can be reused for other purposes, for example for the formation of a hard mask over the first transistor element and the formation of sidewall spacers adjacent the gate electrode of the second transistor element. The hard mask and the sidewall spacers may then be employed in the etching of cavities adjacent the gate electrode of the second transistor element. The cavities may be filled with a stress-creating material other than the material of the semiconductor substrate to form stress-creating elements.

After the formation of the stress-creating elements in the second transistor element, the hard mask may further be used to protect the first transistor element in the formation of source and drain regions in the second transistor element, and the material of the hard mask may re reused for the formation of second sidewall spacers adjacent the gate electrode of the first transistor element. A photoresist mask provided in the formation of the second sidewall spacers may additionally be used in order to protect the second transistor element in the formation of source and drain regions of the first transistor element.

Thus, different stress may be created in channel regions of the first and the second transistor elements with a moderate number of processing steps. This may help reduce the costs of the manufacturing of semiconductor structures comprising transistors having differently stressed channel regions.

Figure 2A:
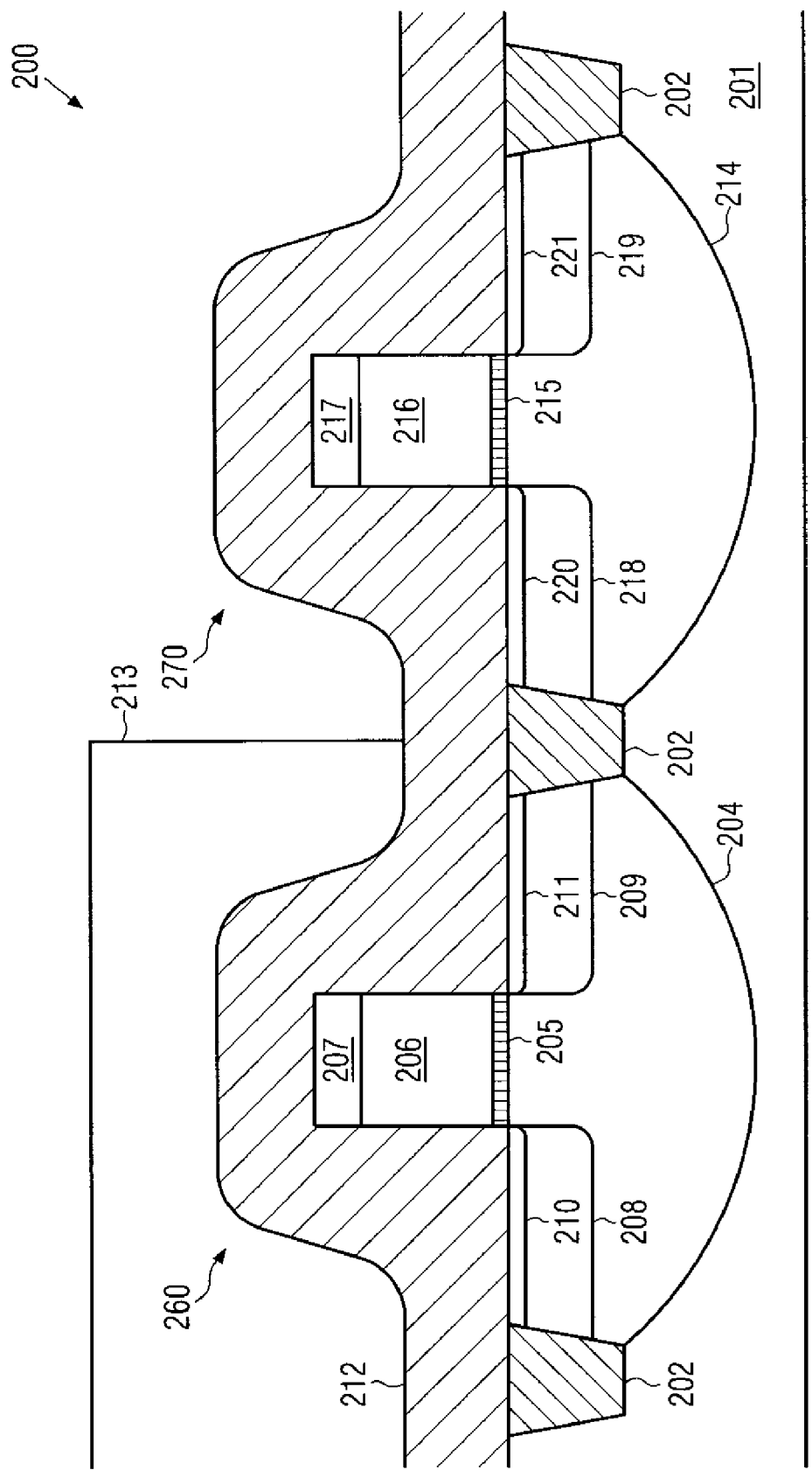
FIGS. 2a-2d show schematic cross-sectional views of a semiconductor structure in stages of a manufacturing process.

FIG. 2a shows a schematic cross-sectional view of a semiconductor structure 200 in a stage of a manufacturing process according to an illustrative embodiment disclosed herein. The semiconductor structure 200 comprises a semiconductor substrate 201, a first transistor element 260 and a second transistor element 270. A trench isolation structure 202 electrically insulates the transistor elements 260, 270 from each other and from other circuit elements (not shown) in the semiconductor structure 200. The trench isolation structure 202, which may comprise an electrically insulating material such as silicon dioxide and/or silicon nitride, can be formed by means of processes of photolithography, etching, deposition and/or oxidation well known to persons skilled in the art.

The first transistor element 260 comprises an active region 204 formed in the substrate 201. Similarly, the second transistor element 270 comprises an active region 214. As persons skilled in the art know, the active regions 204, 214 can be formed by means of one or more ion implantation processes wherein a beam of ions of a dopant material is directed towards the semiconductor structure 200. Regions of the semiconductor structure 200 which are not to be doped can be covered with a photoresist mask.

The active regions 204, 214 can be differently doped. In some embodiments, the first transistor element 260 can be an N-type field effect transistor and the second transistor element 270 can be a P-type field effect transistor. In such embodiments, the active region 204 of the first transistor element 260 can comprise a P-type dopant such as boron (B) and the active region of the second transistor element 270 can comprise an N-type dopant such as arsenic (As). In other embodiments, the first transistor element 260 can be a P-type field effect transistor and the second transistor element 270 can be an N-type field effect transistor. In still further embodiments, the first transistor element 260 and the second transistor element 270 can be field effect transistors of the same type.

The first transistor element 260 comprises a gate electrode 206 formed over the active region 204 and separated therefrom by a gate insulation layer 205. The gate electrode 206 can be covered by a cap layer 207. Similarly, the second transistor element 270 comprises a gate electrode 216, a gate insulation layer 215 and may comprise a cap layer 217. The gate insulation layers 205, 215 may comprise an electrically insulating material such as silicon dioxide, silicon nitride and/or silicon oxynitride. The gate electrodes 206, 216 can comprise an electrically conductive material such as polysilicon and/or a silicide. The gate insulation layers 205, 215, the gate electrodes 206, 216 and the cap layers 207, 217 can be formed by performing various oxidation, deposition, etching and/or photolithography processes that are well known to persons skilled in the art.

A first amorphized region 208 and a second amorphized region 209 can be formed adjacent the gate electrode 206 of the first transistor element 206. To this end, the semiconductor structure 200 can be irradiated with a beam of ions. The ion beam can comprise ions of a non-doping element which do not contribute to the number of charge carriers in the substrate material when they are incorporated into its crystal lattice. The non-doping element can be a noble gas, such as argon (Ar), xenon (Xe) or krypton (Kr). Typical implant energies and doses for the above-identified non-doping elements are in the range of approximately 30-600 keV and approximately $5 \times 10^{14}$-$10^{17}$ ions/cm$^2$. In other embodiments, the non-doping element can be an element of the fourth group of the periodic table of elements, e.g., a semiconductor material such as silicon (Si) or germanium (Ge), which is isoelectronic to a silicon substrate.

Ion energy and ion flux of the ion beam and the time of exposure of the semiconductor structure 200 to the ion beam can be such that the long range order and mostly the short range order of the crystal lattice is lost and the material becomes amorphous. During the implantation of the ions, the substrate 200 may be inclined and/or rotated with respect to a direction of incidence of the ions. Thus, a more even amorphization of the semiconductor material may be obtained in the amorphized regions 208, 209.

In some embodiments, the second transistor element 270 may also be exposed to the ion beams. Thus, amorphized regions 218, 219 can be formed adjacent the gate electrode 216 of the second transistor element 270. In other embodiments, the second transistor element 270 can be covered with a mask, for example, a photoresist mask, to prevent the amorphization of semiconductor material in the second transistor element 270.

An extended source region 210 and an extended drain region 211 can be formed adjacent the gate electrode 206 of the first transistor element 260. As persons skilled in the art know, this can be done by implanting ions of a dopant material into the semiconductor structure 200. The second transistor element 270 can be protected by a photoresist mask during the ion implantation. In addition to the extended source region 210 and the extended drain region 211, an extended source region 220 and an extended drain region 221 can be formed in the second transistor element 270. In the formation of the extended source region 220 and the extended drain region 221, the first transistor element 260 can be protected by a photoresist mask.

The extended source regions 210, 220 and the extended drain regions 211, 221 need not be formed after the formation of the amorphized regions 208, 209, 218, 219. In other embodiments, the extended source regions 210, 220 and the extended drain regions 211, 221 can be formed before the formation of the amorphized regions 208, 209, 218, 219. In still further embodiments, the extended source regions 210, 220, the extended drain regions 211, 221 and the amorphized regions 208, 209, 218, 219 can be formed simultaneously.

In some of these embodiments, an ion dose applied in the formation of the extended source and drain regions 210, 211, 220, 221 can be adapted such that the crystalline order of the semiconductor substrate 201 is destroyed in the extended source and drain regions 210, 211, 220, 221. Thus, amorphized regions 208, 209, 218, 219 having an extension corresponding to that of the extended source and drain regions 210, 220, 211, 221 can be obtained. In order to enhance the amorphizing effect of the ion implantation, ions of a non-doping element can be implanted in addition to the ions of the dopant materials.

In other embodiments, ions of a dopant material and ions of a non-doping material can be implanted simultaneously, wherein the ions of the dopant material and the ions of the non-doping material have a different energy. Thus, different extensions of the extended source and drain regions 210, 211, 220, 221 and the amorphized regions 208, 209, 218, 219 can be obtained.

In still further embodiments, the formation of extended source and drain regions in the first transistor element 260 and the second transistor element 270 can be performed in later stages of the manufacturing process, as will be explained in more detail below.

In one illustrative embodiment, a stressed material layer 212 is deposited over the first transistor element 260 and the second transistor element 270. The stressed material layer 212 can comprise an electrically insulating material such as silicon nitride and/or silicon dioxide. The stressed material layer 212 can comprise an intrinsic tensile stress and/or an intrinsic compressive stress.

In the deposition of the stressed material layer 212, a plasma enhanced chemical vapor deposition process may be employed. As persons skilled in the art know, in a plasma enhanced chemical vapor deposition process, the semiconductor structure 200 is inserted into a reaction vessel to which gaseous reactants can be supplied, for example by means of a showerhead provided above the semiconductor structure 200. The showerhead may comprise a plenum connected to gas sources adapted to provide the gaseous reactants and a porous or perforated distribution plate through which the reactants may flow towards the semiconductor structure 200.

A radio frequency alternating voltage and/or a bias voltage, which can be a low frequency AC voltage or a DC voltage, are applied between the showerhead and the semiconductor structure 200 or an electrode provided in the vicinity thereof to create a glow discharge in the gaseous reactant. The semiconductor structure 200 can be maintained at a predetermined temperature. The glow discharge creates reactive species such as atoms, ions and/or radicals from the reactant gas. On the surface of the semiconductor structure 200 and/or in the vicinity thereof, the reactive species react chemically with each other and form the stressed material layer 212.

The properties of the stressed material layer 212, in particular, the intrinsic stress thereof, can be controlled by varying parameters of the plasma enhanced chemical vapor deposition process such as the frequency and/or power of the radio frequency alternating voltage, the bias voltage, the flow of reactants to the reactor vessel, the pressure in the reactor vessel, the spacing between the showerhead and the semiconductor structure 200 and the temperature of the semiconductor structure 200.

In one embodiment disclosed herein, the stressed material layer 212 may be provided in the form of a silicon nitride layer having a tensile stress of about 900 Mpa by providing a silane flow of about 170 sccm, an ammonia flow of about 260 sccm and a nitrogen flow of about 8600 sccm. The pressure in the reaction vessel may be maintained at about 4.8 Torr, the temperature of the semiconductor structure 200 can be held at about 400° C. and the spacing between the showerhead and the semiconductor structure 200 can be about 900 mils. The radio frequency voltage may have a power of about 300 W. A low bias voltage or substantially no bias voltage at all may be applied.

In another embodiment disclosed herein, the stressed material layer 212 may be provided in the form of a silicon nitride layer having a compressive stress of about 2 Gpa by providing a silane flow of about 100 sccm, an ammonia flow of about 400 sccm and a nitrogen flow of about 9600 sccm. Pressure in the reaction vessel can be about 4.5 Torr and the temperature of the semiconductor structure 200 can be about 400° C. The spacing between the semiconductor structure 200 and the showerhead can be about 400 mils, and the power of the radio frequency alternating voltage can be about 680 W. A low bias voltage or substantially no bias voltage at all may be applied. In other embodiments, other parameters of the plasma enhanced chemical vapor deposition process can be applied, and materials other than silicon nitride can be used for the stressed material layer 212.

After the formation of the stressed material layer 212, an annealing process wherein the semiconductor structure 200 is exposed to a moderately high temperature for a predetermined time may be performed in order to re-crystallize the material in the amorphous regions 208, 209, 218, 219. The annealing process can be a rapid thermal annealing process. As persons skilled in the art know, in rapid thermal annealing, the semiconductor structure 200 can be exposed to the moderately high temperature by irradiating the semiconductor structure 200 with electromagnetic radiation. The electromagnetic radiation can be generated by means of one or more lamps and/or one or more lasers. In other embodiments, a furnace annealing process wherein the semiconductor structure 200 is inserted into a furnace which is maintained at an elevated temperature can be performed.

In the annealing process, the atoms in the amorphized regions 208, 209, 218, 219 re-arrange into a crystalline order. The configuration obtained after the annealing process is influenced both by the crystalline order of portions of the semiconductor substrate 201 below the amorphized regions 208, 209, 218, 219 and by the stressed material layer 212. Due to the presence of the stressed material layer 212, a force is exhibited on the material in the amorphized regions 208, 209, 218, 219 such that the amorphized regions 208, 209, 218, 219 are also stressed. During the annealing process, the material in the amorphized regions 208, 209, 218, 219 re-crystallizes with atoms being arranged in a stressed crystalline configuration. Since the stressed configuration may be metastable, after the annealing process, the stressed crystalline configuration can be maintained even in case of a removal of the stressed material layer 212. Thus, crystalline substrate material having a memorized intrinsic stress can be formed in the regions 208, 209, 218, 219.

In embodiments wherein portions of the semiconductor substrate 201 adjacent the gate electrode 216 of the second transistor element 270 are protected from being irradiated with ions during the formation of the amorphized regions 208, 209, and correspondingly no amorphized regions are formed in the second transistor element 270, no re-arrangement of atoms in the second transistor element 270 may occur, since the original crystalline order of the material of the semiconductor substrate 201 may be metastable under the conditions of the annealing process even in the presence of the stressed material layer 212. Thus, a formation of an intrinsic stress in the second transistor element 270 can be avoided or at least reduced.

The stressed material layer 212 is processed to form from the stressed material layer 212 sidewall spacers 231, 232 adjacent the gate electrode 216 of the second transistor element 270 and a hard mask 230 covering the first transistor element 260.

The processing of the stressed material layer 212 may comprise forming a mask 213 over the first transistor element 260. The mask 213 may comprise a photoresist and may be formed by means of methods of photolithography known to persons skilled in the art.

Figure 2B:
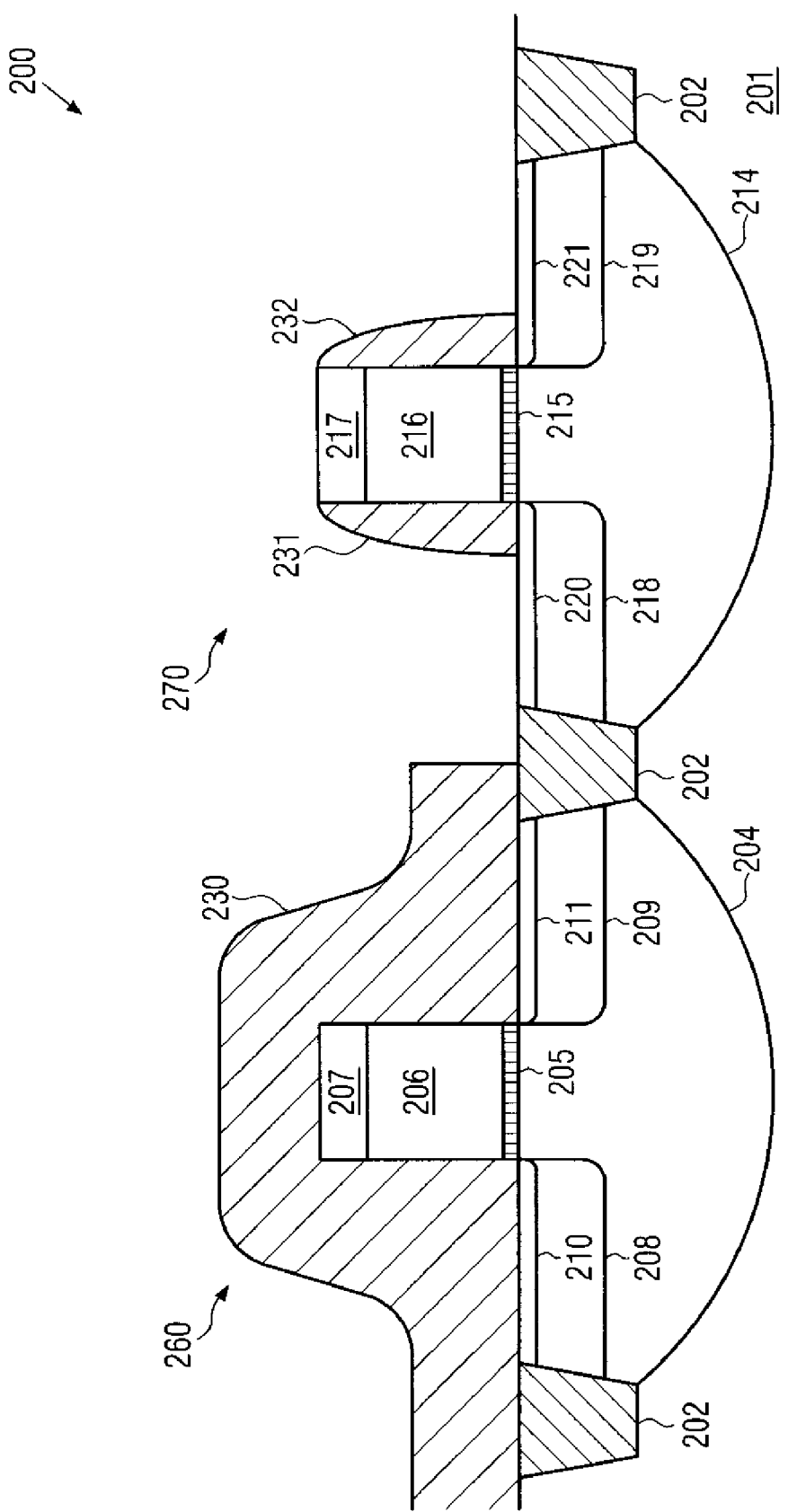

A schematic cross-sectional view of the semiconductor structure 200 in a later stage of the manufacturing process is shown in FIG. 2b. The processing of the stressed material layer 212 can further comprise performing an anisotropic etching process adapted to remove portions of the stressed material layer 212 over substantially horizontal portions of the second transistor element 270, for example the extended source region 220, the extended drain region 221 and the cap layer 217.

The mask 213 protects portions of the stressed material layer 212 over the first transistor element 260 from being affected by an etchant used in the first etching process. Thus, such portions of the stressed material layer 212 remain on the semiconductor structure 200 and form the hard mask 230.

The anisotropic etching process may comprise a dry etching process. As persons skilled in the art know, in dry etching, which is also known as plasma etching, reactive ion etching or ion enhanced etching, a radio frequency glow discharge produces a chemically reactive species, such as atoms, radicals and ions, from a relatively inert molecular gas. The etching gas is selected such that a generated species reacts chemically with the material to be etched, creating a volatile reaction product. The energy of ions impinging on the substrate may be controlled by varying the frequency applied in creating the glow discharge and/or by applying a DC bias to the substrate. In general, a greater energy of the ions leads to a greater anisotropy of the etch process.

The anisotropic etching process is stopped upon a removal of the portions of the stressed material layer 212 over the substantially horizontal portions of the second transistor element 270. Due to the anisotropy of the etching process, portions of the stressed material layer 212 on the flanks of the gate electrode 216 are etched with a lower etch rate. Therefore, residues of the stressed material layer 212 remain on the sidewalls of the gate electrode 216 and form the sidewall spacers 231, 232.

In some embodiments, the annealing process performed in order to re-crystallize the material in the amorphized regions 208, 209, 218, 219 is not performed before the processing of the stressed material layer 212 as detailed above. Instead, the annealing process can be performed after the processing of the stressed material layer 212. In such embodiments, the second transistor element 270 is exposed to the stress created by the stressed material layer 212 to a less extent, since the sidewall spacers 231, 232 may exhibit a considerably lower elastic force on the second transistor element 270 than the complete stressed material layer 212 or may substantially exhibit no elastic force at all. Therefore, the material in the amorphized regions 218, 219 of the second transistor element 270 may re-crystallize substantially without there being a formation of a memorized stress. Since, however, the hard mask 230 may inherit the intrinsic stress of the stressed material layer 212, an intrinsic stress may be formed in the re-crystallized amorphous regions 208, 209 of the first transistor element 260. Thus, the first transistor element 260 may be selectively provided with stressed regions adjacent its gate electrode 206.

In embodiments wherein no amorphized regions are formed in the second transistor element 270, performing the annealing process after the processing of the stressed material layer 212 may help avoid a re-arrangement of atoms in portions of the semiconductor substrate 201 adjacent the gate electrode 216 of the second transistor element 270 into a stressed order. This may be particularly helpful in embodiments where the stressed material layer 212 comprises a relatively large intrinsic stress.

Figure 2C:
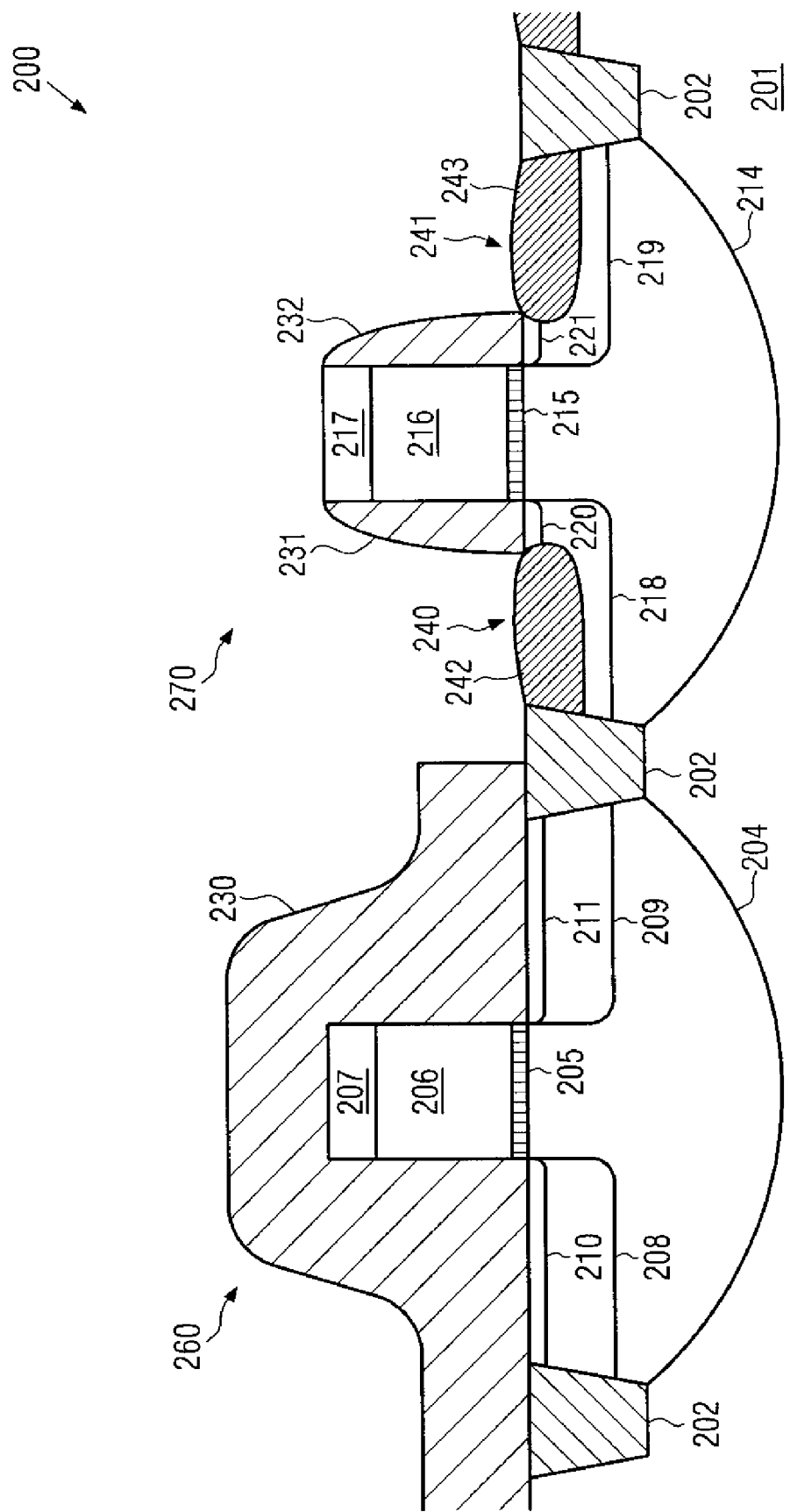

FIG. 2c shows a schematic cross-sectional view of the semiconductor structure 200 in a later stage of the manufacturing process. A source side cavity 240 and a drain side cavity 241 are formed in the substrate adjacent the gate electrode 216 of the second transistor element 270. This can be done by performing an etching process, for example, a dry etching process, adapted to remove the material of the semiconductor substrate 201, leaving the hard mask 230, the sidewall spacers 231, 232, the cap layer 217 and the trench isolation structure 202 substantially intact. The etching process may be substantially isotropic or may have a low degree of anisotropy. Thus, the cavities 240, 241 may extend below the sidewall spacers 231, 232 or even below the gate electrode 216 of the second transistor element 270. This may help provide stress-creating elements in the vicinity of the channel region of the second transistor element 270, which may help increase the stress in the channel region.

After the formation of the cavities 240, 241, a first stress-creating element 242 and a second stress-creating element 243 are formed in the cavities 240, 241. This can be done by means of a selective epitaxial growth process. Selective epitaxial growth is a variant of plasma enhanced chemical vapor deposition well known to persons skilled in the art wherein process parameters, such as temperature, pressure and composition of the reactant gas, are adapted such that a layer of material is deposited only on the exposed portions of the substrate 201, in particular in the cavities 240, 241, whereas there is substantially no deposition on the trench isolation structure 202, the cap layer 217, the sidewall spacers 231, 232 and the hard mask 230.

In embodiments wherein the substrate 201 comprises silicon and the cap layer 217, the trench isolation structure 202, the sidewall spacers 231, 232 and the hard mask 230 comprise silicon dioxide and/or silicon nitride, dichlorosilane ($SiH_2Cl_2$) and germane ($GeH_4$) can be used as reactant gases to form stress-creating elements 242, 243 comprising silicon germanide. Additionally, hydrogen may be provided as a carrier gas and hydrochloric acid (HCl) may be supplied in order to increase the selectivity of the epitaxial growth of silicon germanide.

Since the silicon germanide of the stress-creating elements 242, 243 has a greater lattice constant than the silicon of the substrate 201, the stress-creating elements 242, 243 may be compressively stressed. The stress of the stress-creating elements 242, 243 may also act on portions of the substrate 201 in the vicinity of the stress-creating elements 242, 243, in particular on portions of the substrate 201 below the gate electrode 216 of the second transistor element 270 wherein a channel region will be formed. Thus, the mobility of holes in the channel region of the second transistor element 270 may be increased.

The present invention is not restricted to embodiments wherein the stress-creating elements 242, 243 comprise silicon germanide. In other embodiments, the stress-creating elements 242, 243 may comprise silicon carbide. Silicon carbide has a lattice constant which is smaller than the lattice constant of silicon. The silicon carbide in the stress-creating elements 242, 243, however, may adapt to the crystal lattice of the silicon in the substrate 201 such that the stress-creating elements 242, 243 are subject to a tensile stress. The tensile stress may influence the stress state of portions of the substrate 201 in the vicinity of the stress-creating elements 242, 243. Thus, a tensile stress may be created in a channel region below the gate electrode 216 of the second transistor element 270. Similar to the stress-creating elements 242, 243 when comprising silicon germanide, the stress-creating elements 242, 243 when comprising silicon carbide may be formed by means of selective epitaxial growth. Selective epitaxial growth of silicon carbide can be effected by creating a radio frequency glow discharge in a gas comprising silane ($SiH_4$), ethene ($C_2H_4$) and hydrochloric acid (HCl).

Figure 2D:
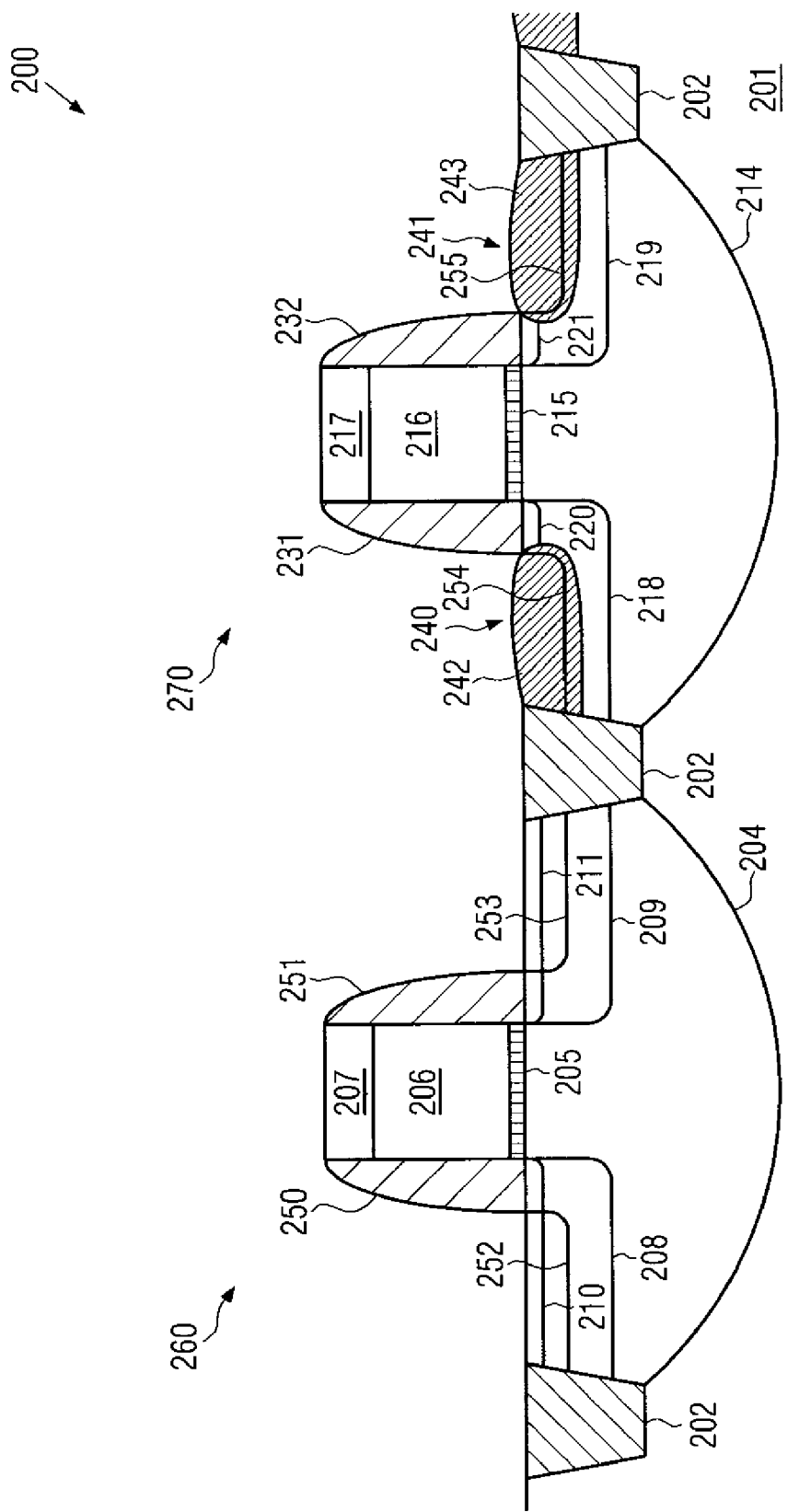

FIG. 2d shows a schematic cross-sectional view of the semiconductor structure 200 in a later stage of the manufacturing process. A source region 254 and a drain region 255 are formed adjacent the gate electrode 216 of the second transistor element 216. This can be done by implanting ions of a dopant material by means of a known ion implantation process. The hard mask 230 may remain on the surface of the semiconductor structure 200 during the ion implantation process. Thus, the hard mask 230 absorbs ions directed towards the first transistor element 206. Hence, an implantation of ions into the first transistor element 260 or portions thereof may be avoided. The sidewall spacers 231, 232 absorb ions impinging in the vicinity of the gate electrode 216 of the second transistor element 270. Thus, the source region 254 and the drain region 255 are spaced apart from the gate electrode 216.

The hard mask 230 is at least partially removed. In embodiments wherein the hard mask 230 is partially removed, a photoresist mask (not shown) can be formed over the second transistor element 270 by means of known photolithographic techniques. Then, an anisotropic etching process, for example a dry etching process, adapted to selectively remove the material of the hard mask 230 can be performed. The photoresist mask protects the second transistor element 270 from being affected by an etchant used in the anisotropic etching process. Thus, the sidewall spacers 231, 232 remain on the sidewalls of the gate electrode 216 of the second transistor element 270.

Due to the anisotropy of the etching process, portions of the hard mask 230 over substantially horizontal portions of the first transistor element 260, for example portions over the cap layer 207, the extended source region 210 and the extended drain region 211 are removed at a greater etch rate than portions of the hard mask 230 over inclined portions of the first transistor element 206 such as the flanks of the gate electrode 206. The etching process can be stopped as soon as the portions of the hard mask 230 over the substantially horizontal portions of the first transistor element 206 are removed. Residues of the hard mask 230 remaining on the sidewalls of the gate electrode 206 form second sidewall spacers 250, 251.

After the formation of the second sidewall spacers 250, 251, a further ion implantation process may be performed to form a source region 252 and a drain region 253 adjacent the gate electrode 206 of the first transistor element 260. The second sidewall spacers 250, 251 absorb ions impinging in the vicinity of the gate electrode 206 such that the source region 252 and the drain region 253 are spaced apart from the gate electrode 206.

The photoresist mask formed before the partial removal of the hard mask 230 and the second sidewall spacers 250, 251 may remain on the second transistor element 270 during the formation of the source region 252 and the drain region 253. The photoresist mask may absorb ions flying towards the second transistor element 270 such that an implantation of ions into the second transistor element 270 can be avoided.

In other embodiments, the hard mask 230 may be completely removed. Moreover, in such embodiments, the sidewall spacers 231, 232 may be removed.

The hard mask 230 and the sidewall spacers 231, 232 may be removed by means of an etching process adapted to selectively remove the material of the hard mask 230 and the sidewall spacers 231, 232, leaving other materials of the semiconductor structure 200, for example, the materials of the trench isolation structure 202, the substrate 201, the stress-creating elements 242, 243 and the gate electrodes 206, 207, substantially intact. The cap layers 207, 217, however, may be removed in the etching process. The etching process may be a dry etching process and may be substantially isotropic.

In embodiments wherein the extended source regions 210, 220 and the extended drain regions 211, 221 have not been formed before the deposition of the stressed material layer 212, extended source and drain regions may be formed adjacent the gate electrodes 206, 216 after the removal of the hard mask 230 and the sidewall spacers 231, 232 by means of one or more ion implantation processes wherein portions of the semiconductor structure 200 which are not to be irradiated with ions may be protected by a photoresist mask. Thereafter, second sidewall spacers (not shown) may be formed on the flanks of each of the gate electrodes 206, 216 and further ion implantation processes may be performed to form source and drain regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:
   providing a semiconductor substrate comprising a first transistor element and a second transistor element, each of said first transistor element and said second transistor element comprising a gate electrode;
   depositing a stressed material layer over said first transistor element and said second transistor element;
   processing said stressed material layer to form from said stressed material layer sidewall spacers adjacent the gate electrode of the second transistor element and a hard mask covering the first transistor element;
   forming a pair of cavities in said substrate adjacent the gate electrode of the second transistor element;
   forming a pair of stress-creating elements in said cavities; and
   at least partially removing said hard mask.

2. The method of claim 1, further comprising performing an ion implantation process adapted to amorphize portions of said semiconductor substrate adjacent the gate electrode of the first transistor element before the deposition of the stressed material layer.

3. The method of claim 2, wherein said ion implantation process comprises an implantation of ions of a dopant material.

4. The method of claim 2, wherein said ion implantation process comprises an implantation of ions of at least one of a noble gas and a semiconductor material.

5. The method of claim 2, further comprising amorphizing portions of the semiconductor substrate adjacent the gate electrode of the second transistor element before the deposition of the stressed material layer.

6. The method of claim 1, further comprising forming an extended source region and an extended drain region adjacent at least one of the gate electrode of the first transistor element and the gate electrode of the second transistor element before the deposition of the stressed material layer.

7. The method of claim 1, further comprising performing an annealing process after said formation of said stressed material layer.

8. The method of claim 7, wherein said annealing process comprises at least one of a rapid thermal annealing process and a furnace annealing process.

9. The method of claim 1, wherein said hard mask and said sidewall spacers are substantially completely removed after said formation of said pair of stress-creating elements.

10. The method of claim 9, wherein said removal of said hard mask and said sidewall spacers comprises performing an etching process.

11. The method of claim 1, wherein said hard mask is partially removed after said formation of said pair of stress-creating elements, said partial removal of said hard mask comprising:
   forming a mask over said second transistor element;
   performing an anisotropic etching process adapted to remove portions of said hard mask over substantially horizontal portions of said first transistor element, wherein residues of said hard mask adjacent the gate electrode of the first transistor element are not removed and form second sidewall spacers; and
   removing said mask.

12. The method of claim 1, wherein said processing of said stressed material layer comprises:
   forming a mask over said first transistor element, wherein said second transistor element is not covered by said mask;
   performing an etching process adapted to remove portions of said stressed material layer over substantially horizontal portions of said second transistor element, wherein residues of said stressed material layer adjacent the gate electrode of the second transistor element are not removed and form said sidewall spacers, and wherein portions of the stressed material layer over the first transistor element are protected from being etched by said mask and form the hard mask; and
   removing said mask.

13. The method of claim 1, wherein said formation of said pair of cavities comprises performing an etching process adapted to remove a material of said semiconductor substrate, leaving said hard mask and said sidewall spacers substantially intact.

14. The method of claim 1, wherein said formation of said pair of stress-creating elements comprises performing a selective epitaxial growth process adapted to deposit a stress-creating material adjacent the gate electrode of the second transistor element.

15. The method of claim 1, wherein said stressed material layer comprises an intrinsic stress having an absolute value of about 900 Mpa or more.

16. The method of claim 1, wherein said stressed material layer comprises an intrinsic tensile stress.

17. The method of claim 1, wherein said first transistor element comprises an active region comprising a P-type dopant and said second transistor element comprises an active region comprising an N-type dopant.

18. A method of forming a semiconductor structure, comprising:
   forming a first gate electrode structure and a second gate electrode structure above a semiconductor substrate;
   forming an extended source region and an extended drain region in said semiconductor substrate adjacent said second gate electrode structure;
   depositing a stressed material layer over said first and second gate electrode structures;
   forming sidewall spacers adjacent said second gate electrode structure, wherein forming said sidewall spacers comprises performing an etching process adapted to remove portions of said stressed material layer over said second gate electrode structure;
   forming a first cavity in said extended source region adjacent said second gate electrode structure and a second cavity in said extended drain region adjacent said second gate electrode structure; and
   forming a first stress-creating element in said first cavity and a second stress-creating element in said second cavity.

19. The method of claim 18, wherein forming said first and second stress-creating elements comprises depositing a stress-creating material adjacent said second gate electrode structure by performing a selective epitaxial growth process.

20. The method of claim 19, further comprising amorphizing portions of said semiconductor substrate adjacent said first and second gate electrode structures prior to depositing said stressed material layer, wherein amorphizing portions of said semiconductor substrate comprises performing an ion implantation process.

21. The method of claim 19, wherein said first and second stress-creating elements comprise an intrinsic compressive stress.

22. The method of claim 21, wherein said stress-creating material of said first and second stress-creating elements comprises silicon germanide.

23. The method of claim 19, wherein said first and second stress-creating elements comprise an intrinsic tensile stress.

24. The method of claim 23, wherein said stress-creating material of said first and second stress-creating elements comprises silicon carbide.

* * * * *

UNITED STATES PATENT AND TRADEMARK OFFICE
CERTIFICATE OF CORRECTION

| | | |
|---|---|---|
| PATENT NO. | : 7,608,499 B2 | Page 1 of 1 |
| APPLICATION NO. | : 11/685847 | |
| DATED | : October 27, 2009 | |
| INVENTOR(S) | : Karla Romero et al. | |

It is certified that error appears in the above-identified patent and that said Letters Patent is hereby corrected as shown below:

Col. 14, line 28 (claim 1, line 5), delete "transitor" and insert therefor

-- transistor --.

Signed and Sealed this

Fifteenth Day of December, 2009

David J. Kappos
*Director of the United States Patent and Trademark Office*